United States Patent
Chae et al.

(10) Patent No.: US 11,380,697 B2
(45) Date of Patent: Jul. 5, 2022

(54) RAISED PAD FORMATIONS FOR CONTACTS IN THREE-DIMENSIONAL STRUCTURES ON MICROELECTRONIC WORKPIECES

(71) Applicant: Tokyo Electron Limited, Tokyo (JP)

(72) Inventors: Soo Doo Chae, Albany, NY (US); Sang Cheol Han, Albany, NY (US); Youngwoo Park, Gyeonggi-do (KR)

(73) Assignee: Tokyo Electron Limited, Tokyo (JP)

(*) Notice: Subject to any disclaimer, the term of this patent is extended or adjusted under 35 U.S.C. 154(b) by 150 days.

(21) Appl. No.: 16/800,344

(22) Filed: Feb. 25, 2020

(65) Prior Publication Data

US 2021/0265369 A1    Aug. 26, 2021

(51) Int. Cl.
*H01L 27/11582* (2017.01)
*H01L 27/11524* (2017.01)
*H01L 21/285* (2006.01)
*H01L 27/11556* (2017.01)

(52) U.S. Cl.
CPC .. *H01L 27/11524* (2013.01); *H01L 27/11582* (2013.01); *H01L 21/28556* (2013.01); *H01L 27/11556* (2013.01)

(58) Field of Classification Search
CPC .............. H01L 27/11578; H01L 27/11582
See application file for complete search history.

(56) References Cited

U.S. PATENT DOCUMENTS

| | | | |
|---|---|---|---|
| 9,230,974 B1 | 1/2016 | Pachamuthu et al. | |
| 9,379,124 B2 | 6/2016 | Sharangpani et al. | |
| 9,449,981 B2 | 9/2016 | Pachamuthu et al. | |
| 10,340,143 B1 | 7/2019 | Liu et al. | |
| 2009/0315093 A1 | 12/2009 | Li et al. | |
| 2015/0140821 A1* | 5/2015 | Kubota | H01L 21/31144 438/694 |
| 2016/0056165 A1 | 2/2016 | Imamura | |
| 2016/0240555 A1* | 8/2016 | Lee | H01L 27/11582 |
| 2016/0343580 A1 | 11/2016 | Hudson | |

(Continued)

OTHER PUBLICATIONS

Korean Intellectual Property Office, The International Search Report and Written Opinion for International Application No. PCT/US2021/019323, dated Jun. 15, 2021, 9 pages.

*Primary Examiner* — Christopher A Johnson

(57) ABSTRACT

Embodiments provide raised pad formations for step contacts in three-dimensional structures formed on microelectronic workpieces. Steps are formed in a multilayer stack that is used for the three-dimensional structure. The multilayer stack includes alternating non-conductive and conductive layers. For one embodiment, alternating oxide and polysilicon layers are used. The steps expose contact regions on different conductive layers. Material layers are formed on the contact regions to form raised pads. The material layers preferably have a high selectivity with respect to the non-conductive material for etch processes. A protective layer is formed over the steps and the raised pads, and contact holes are formed through the protective layer to the raised pads. Contacts are then formed within the contact holes. The raised pads inhibit punch-through of the non-conductive layers during the forming of the contact holes thereby improving performance of resulting devices formed in the microelectronic workpieces.

9 Claims, 6 Drawing Sheets

(56) References Cited

U.S. PATENT DOCUMENTS

| 2017/0194255 | A1  | 7/2017  | Oh |
| 2019/0043876 | A1* | 2/2019  | van Schravendijk ........................ H01L 27/11575 |
| 2019/0363014 | A1* | 11/2019 | Lee ................... H01L 27/11575 |
| 2020/0035553 | A1* | 1/2020  | Yatsu .................. C23C 18/1879 |
| 2020/0111808 | A1* | 4/2020  | Liu ................... H01L 21/76829 |

\* cited by examiner

RAISED PAD FORMATIONS FOR CONTACTS IN THREE-DIMENSIONAL STRUCTURES ON MICROELECTRONIC WORKPIECES

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of layers of material on a substrate. To meet the physical and electrical specifications of current and next generation semiconductor devices, process flows are being requested to reduce feature size while maintaining structure integrity for various patterning processes.

Three-dimensional (3D) structures are becoming common formations on microelectronic workpieces to increase device density. Examples of such 3D structures for microelectronic workpieces include fin field-effect transistors (FINFETs), 3D memory structures, and/or other 3D structures. As the density requirements increase, however, improvements are needed to reduce production costs and to maintain device integrity in 3D structures such as 3D memory structures.

To increase density and lower cost-per-bit for memory devices, three-dimensional (3D) memory structures have been formed using current processes. For example, vertical NAND (VNAND) memory cells have been developed using 3D stacked structures. As higher stacks have been implemented, manufacturing costs have increased. For one embodiment, stacked structures of alternating oxide (e.g., $SiO_2$) and polysilicon layers have been used to reduce costs as compared to other multilayer stacked structures. These oxide-polysilicon-oxide-polysilicon (OPOP) structures can be stacked to desired heights and require a reduced number of process steps as compared to prior multilayer stacked structures.

FIG. 1 (Prior Art) is a perspective view 100 of an example embodiment for a 3D structure including an OPOP stack 102. The OPOP stack 102 includes alternating polysilicon layers 106 and oxide layers 108. Only a portion of the OPOP stack 102 is shown and has been removed to reveal channel holes 104 formed within the OPOP stack 102. It is understood that the OPOP stack 102 continues underneath the top polysilicon layer 106. Although not shown, it is also understood that the OPOP stack 102 can be formed over one or more other material layers on a substrate for a microelectronic workpiece. For certain embodiments, the channel holes 104 within the OPOP stack 102 can be used to form 3D memory cells. For example, vertical NAND memory cells are currently being manufactured using channel holes 104 formed in an OPOP stack 102. Further, single-level cell (SLC) memories, multi-level cell (MLC) memories such as triple-level cell (TLC) and quad-level cell (QTC) memories, and/or other memory or device structures can be formed using these techniques.

While the OPOP stacks have reduced cost for 3D memories as compared to other multilayer chemistries (e.g., those using alternating oxide and tungsten layers), the use of OPOP stacks have led to other problems. For example, reduced etch selectivity of the polysilicon layers to the oxide layers in the OPOP structures have led to an increase in punch-through defects and related leakage problems in device structures formed in microelectronic workpieces.

FIGS. 2A-2D (Prior Art) provide cross-section views of example process steps to form contacts to polysilicon layers in an OPOP stack according to prior solutions where punch-through defects and leakage problems have been found to occur.

FIG. 2A (Prior Art) is a cross-section view 200 of an example OPOP stack 102 after steps 204, 206, and 208 have been formed with respect to a portion of the OPOP stack 102. For example, one or more etch processes can be used to etch the OPOP stack 102 to form a step 208 that removes the top polysilicon layer 106 and oxide layer 108, to form a step 206 that removes the top two pairs of polysilicon layers 106 and oxide layers 108, and to form a step 204 that removes the top three pairs of polysilicon layers 106 and oxide layers 108. For the embodiment shown, the OPOP stack 102 has been formed over underlying layer 202, such as a semiconductor substrate for a microelectronic workpiece. It is noted that the depth of the steps 204, 206, and 208 within the OPOP stack 102 are provided as one example and other depths could be used. Further, additional and/or different numbers of steps as well as locations of steps can be used depending upon contact regions desired for a particular structure being formed. It is also noted that the etch processes can include one or more wet etch processes, plasma etch processes, reactive ion etch processes, and/or other etch processes or combinations of etch processes.

FIG. 2B (Prior Art) is a cross-section diagram view 210 of an example structure after one or more deposition processes have been performed to form a protective layer 212 over the OPOP stack 102 and the steps 204/206/208 shown in FIG. 2A (Prior Art). The protective layer 212 is preferably an oxide layer, although other protective materials or combinations of materials can be used. It is noted that the deposition processes can include one or more atomic layer deposition (ALD) processes, chemical vapor deposition (CVD) processes, plasma deposition processes, and/or other layer deposition processes or combinations of processes.

FIG. 2C (Prior Art) is a cross-section view 220 of an example structure after one or more etch processes have been used to open contact holes 224, 226, and 228 through the protective layer 212 to the top polysilicon layers 106 for the steps 204, 206, and 208 shown in FIG. 2A (Prior Art). It is noted that the etch processes can include one or more wet etch processes, plasma etch processes, reactive ion etch processes, and/or other etch processes or combinations of etch processes.

As shown in FIG. 2C (Prior Art), the landing area 225 for contact hole 224 stops on the polysilicon layer 106 for its step. However, the landing area 227 for contact hole 226 extends through the polysilicon layer 106 for its step. Further, the landing area 229 for contact hole 229 extends through the polysilicon layer 106 for its step and mostly through the underlying oxide layer 108 for its step. While contact holes 226 and 228 would preferably stop on the polysilicon layers 106, etching into and through the polysilicon layers 106 tends to occur due to the relatively low etch selectivity of polysilicon to oxide as well as the relatively thin layers being used in OPOP stacks for 3D memory structures. For example, a typical etch selectivity for oxide to polysilicon using typical oxide etch chemistries is 5 to 1 (e.g., oxide etches five times faster than polysilicon). Even though this 5:1 selectivity provides some protection against punch-through into underlying oxide layers, the numbers of punch-through defects are increasing due to increased OPOP stack heights and decreasing layer thicknesses. These punch-through defects can lead to problems, such as leakage problems and short circuits in resulting device structures. Although prior multi-layer stacks using tungsten layers instead of polysilicon layers suffered fewer punch-through defects due to the 20-to-1 etch selectivity of oxide to tungsten (e.g., oxide etches twenty times faster than tungsten), these oxide-tungsten stacks were considerable more expensive and difficult to form as compared to OPOP stacks.

FIG. 2D (Prior Art) is a cross-section view 230 of an example structure after one or more deposition processes have been used to form contacts 234, 236, and 238 within the contact holes 224, 226, and 228 shown in FIG. 2C (Prior Art). It is noted that the contacts 234, 236, and 238 can be formed using a conductive material such as titanium or a titanium-containing material, although other conductive materials or combinations of materials could also be used. It is further noted that the deposition processes can include one or more atomic layer deposition (ALD) processes, chemical vapor deposition (CVD) processes, plasma deposition processes, and/or other layer deposition processes or combinations of processes.

As described with respect to FIG. 2C (Prior Art), the contact holes 226 and 228 do not stop on the polysilicon layers 106 for their respective steps. As such, the contacts 236 and 238 shown in FIG. 2D (Prior Art) also do not stop on the polysilicon layers 106 for their respective steps. In particular, the contact region 240 with respect to contact 238 extends mostly through the underlying oxide layer 108. This punch-through defect reduces the amount of oxide above the next polysilicon layer 106 thereby causing undesired leakage into the next polysilicon layer 106 from contact region 240 during device operations. Device performance is thereby degraded.

SUMMARY

Embodiments are described herein that provide raised pad formations for step contacts in three-dimensional structures formed on microelectronic workpieces. Steps are formed in a multilayer stack that is used for a three-dimensional structure. The multilayer stack includes alternating non-conductive layers and conductive layers, and the steps expose contact regions on different conductive layers. Material layers are formed on the contact regions to form raised pads. A protective layer is formed over the steps and the raised pads, and contact holes are formed through the protective layer to the raised pads. Contacts are then formed within the contact holes. As described herein, the raised pads inhibit punch-through of the non-conductive layers during the forming of the contact holes thereby improving performance of resulting devices formed in the microelectronic workpieces. Different or additional features, variations, and embodiments can also be implemented, and related systems and methods can be utilized as well.

For one embodiment, a method to form structures for a microelectronic workpiece is disclosed including forming steps in a multilayer stack including alternating non-conductive layers and conductive layers to expose contact regions on different conductive layers, forming material layers on the contact regions to form raised pads, forming a protective layer over the steps and the raised pads, forming contact holes through the protective layer to the raised pads, and forming contacts within the contact holes, where the raised pads inhibit punch-through of the non-conductive layers during the forming of the contact holes.

In additional embodiments, the alternating non-conductive layers and conductive layers include oxide layers and polysilicon layers. In further additional embodiments, the multilayer stack is part of a three-dimensional memory structure formed on the microelectronic workpiece.

In additional embodiments, the forming material layers includes selectively depositing material on the contact regions to form the raised pads. In further embodiments, the selectively depositing includes one or more atomic layer deposition (ALD) processes.

In additional embodiments, the non-conductive layers include oxide layers; the protective layer include an oxide layer; and the material layers include ruthenium (Ru). In further embodiments, the forming contact holes includes performing one or more plasma etch processes including a carbon-fluoride based chemistry.

In additional embodiments, the non-conductive layers include oxide layers; the protective layer includes an oxide layer; and the forming contact holes includes one or more oxide etch processes that are selective to oxide with respect to the material layers. In further embodiments, the material layers have an etch selectivity to oxide such that an etch rate for oxide is at least five hundred times or greater than an etch rate for the material layers.

In additional embodiments, the material layers are selectively deposited and include at least one of a metal, a metal-oxide, or a metal-nitride. In further additional embodiments, the material layers include a metal including at least one of Ru, Mo, W, Ti, Ta, Co, or Ni. In further additional embodiments, the material layers include a metal-oxide including at least one of AlO, TiO, or SnO. In further additional embodiments, the material layers include a metal-nitride including at least one of SiN, SiCN, TiN, AlN, or TaN.

In additional embodiments, the material layers are epitaxial layers grown on the contact regions. In further embodiments, the epitaxial layers include at least one of Si, Ge, Si—Ge, an Si alloy, or a Ge alloy.

For one embodiment, a structure formed on a microelectronic workpiece is disclosed including a multilayer stack including alternating non-conductive layers and conductive layers, steps formed in the multilayer stack to form contact regions on different conductive layers, material layers formed on the contact regions to provide raised pads, a protective layer formed over the steps and the raised pads, and contacts formed through the protective layer to the raised pads, where punch-through of the non-conductive layers is inhibited by the raised pads.

In additional embodiments, the alternating non-conductive layers and conductive layers include oxide layers and polysilicon layers. In further additional embodiments, the multilayer stack is part of a three-dimensional memory structure formed on the microelectronic workpiece.

In additional embodiments, the non-conductive layers include oxide layers; the protective layer include an oxide layer; and the material layers include ruthenium (Ru).

In additional embodiments, the non-conductive layers include oxide layers; the protective layer includes an oxide layer; and the material layers have an etch selectivity to oxide such that an etch rate for oxide is at least five hundred times or greater than an etch rate for the material layers.

In additional embodiments, the material layers include a metal including at least one of Ru, Mo, W, Ti, Ta, Co, or Ni. In further additional embodiments, the material layers include a metal-oxide including at least one of AlO, TiO, or SnO. In further additional embodiments, the material layers include a metal-nitride including at least one of SiN, SiCN, TiN, AlN, or TaN.

In additional embodiments, the material layers include epitaxial layers grown on the contact regions, and the epitaxial layers include at least one of Si, Ge, Si—Ge, an Si alloy, or a Ge alloy.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
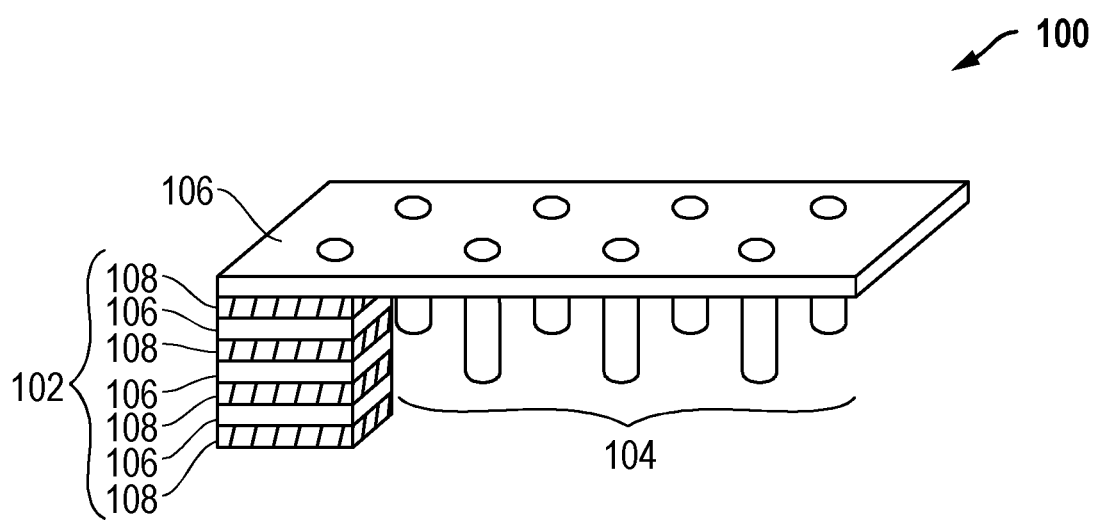
FIG. 1 (Prior Art) is a perspective view of an example embodiment for a three-dimensional structure including an OPOP stack used in three-dimensional memories.

Methods and structures are disclosed that provide raised pad formations for step contacts in three-dimensional structures to inhibit punch-through defects associated with prior solutions. As described further below, steps are formed in a multilayer stack that includes alternating non-conductive layers and conductive layers, and the steps expose contact regions on different conductive layers. Material layers are formed on the contact regions to form raised pads. A protective layer is formed over the steps and the raised pads, and contact holes are formed through the protective layer to the raised pads. Contacts are then formed within the contact holes. The raised pads inhibit punch-through of the non-conductive layers during formation of the contact holes thereby reducing or eliminating leakage problems in prior solutions. The disclosed embodiments are useful for 3D structures formed on microelectronic workpieces including 3D memories such as those based upon VNAND memory cells. Other advantages and implementations can also be achieved while still taking advantage of the process techniques described herein.

FIGS. 3A-3D provide cross-section views of example process steps where material layers are formed on exposed polysilicon step contact regions in an OPOP stack to provide raised pads that reduce or eliminate punch-through defects experienced by prior solutions. The material layers preferably have a high selectivity with respect to oxide so as to inhibit punch-through during oxide etch processes that form contact holes within steps formed in the OPOP stack. It is further noted that the embodiments described herein can be used for OPOP stacks having any desired numbers of layers. However, the disclosed embodiments are particularly useful for OPOP stacks having one hundred twenty-eight layers (128L) or more, or OPOP stacks having two hundred and fifty-six layers (256L). As described above, punch-through defects increase as the number of stack levels increases, and the disclosed embodiments reduce or eliminate these punch-through defects.

It is noted that 3D memory structures are one example of 3D structures formed on microelectronic workpieces that can take advantage of the techniques described herein. As such, it is understood that the techniques described herein can be used with other 3D structures such as fin field-effect transistors (FINFETs) and/or other 3D structures where contact holes are formed through multilayer stacks. It is further noted that while alternating oxide and polysilicon layers are described herein for the multilayer stacks shown in the example embodiments of FIGS. 3A-3D, other non-conductive materials and conductive materials could also be used for the alternating layers within the multilayer stacks. More generally, therefore, it is understood that the multilayer stacks described herein can include alternating non-conductive layers and conductive layers of other materials in addition to and/or instead of oxide and polysilicon materials, while still taking advantage of the techniques described herein.

Figure 2A:
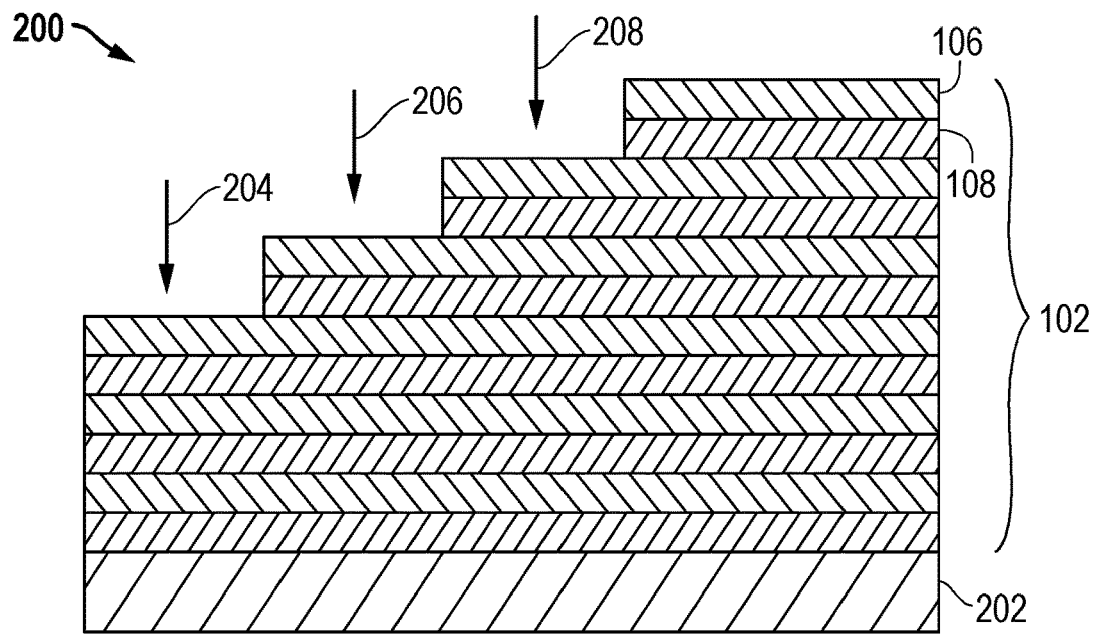
FIGS. 2A-2D (Prior Art) provide cross-section views of example process steps to form contacts to polysilicon layers in an OPOP stack according to prior solutions where punch-through defects and leakage problems have been found to occur.
Figure 2B:
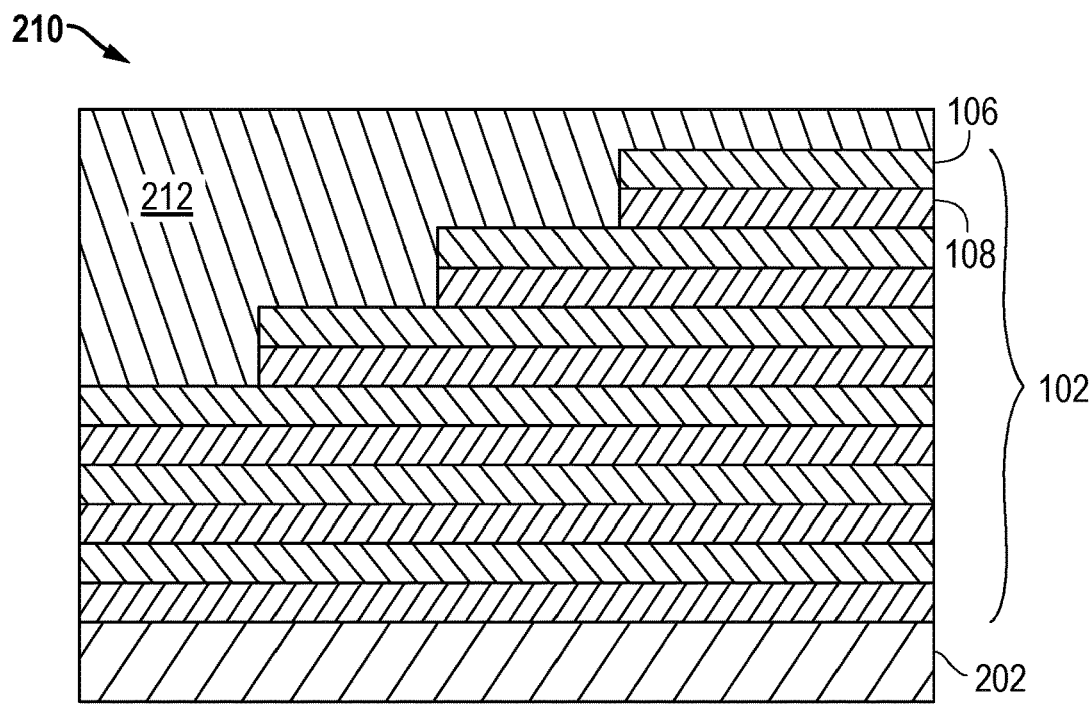
Figure 3A:
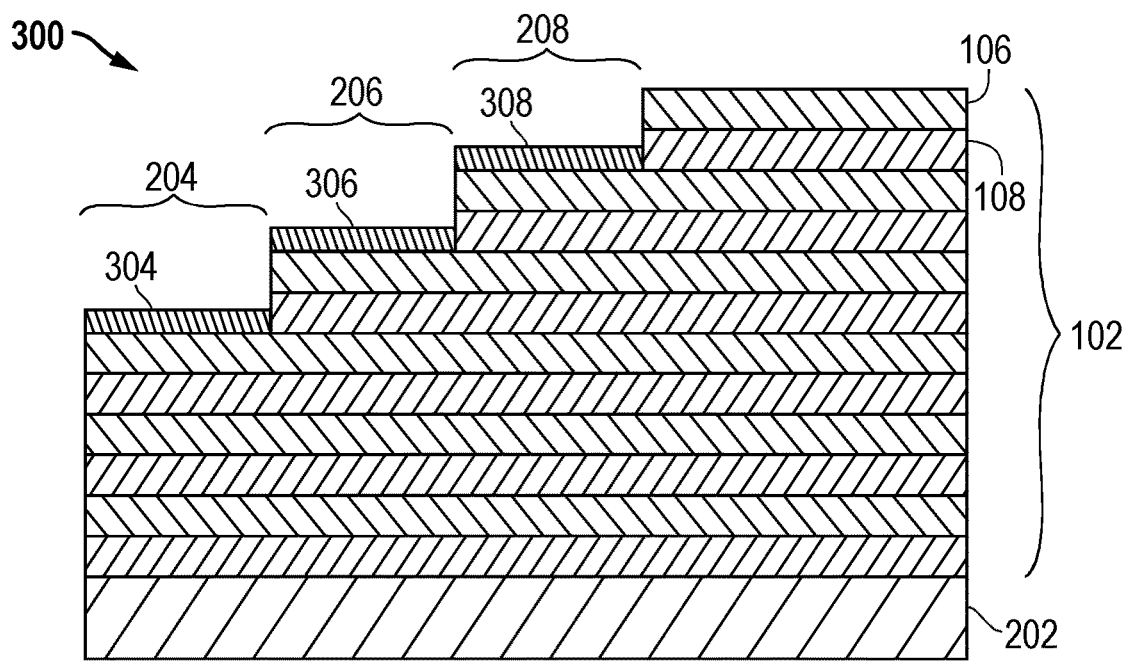
FIGS. 3A-3D provide cross-section views of example process steps where material layers are formed on exposed step contact regions in a multilayer stack to provide raised pads that reduce or eliminate punch-through defects experienced by prior solutions.

FIG. 3A is a cross-section view 300 of an example OPOP stack 102 after one or more deposition processes have been used to form material layers 304, 306, and 308 on steps 204, 206, and 208. These material layers 304, 306, and 308 provide raised pad formations preferably having high etch selectivity as compared to the oxide layers 108 within the OPOP stack 102. For the embodiment shown, the OPOP stack 102 has been formed over underlying layer 202, such as a semiconductor substrate for a microelectronic workpiece. It is also noted that the steps 204, 206, and 208 can be formed with respect to a portion of the OPOP stack 102 as described with respect to FIG. 2A (Prior Art) above. The deposition processes can include one or more atomic layer deposition (ALD) processes, chemical vapor deposition (CVD) processes, plasma deposition processes, and/or other layer deposition processes or combinations of processes. Further, the depositions processes can be selective such that the material layers 304, 306, and 308 are selectively deposited in particular regions where raised pad formations and related contacts are desired to be made on the polysilicon layers 106 within the OPOP stack 102.

As described further herein, the material used to form the pad formations through material layers 304, 306, and 308 preferably has a high etch selectivity with respect to oxide for oxide etch chemistries. For example, it is preferred that the etch selectivity of oxide to this material for oxide etch chemistries be at least five hundred-to-one (500-to-1) such that the etch rate for oxide is at least five hundred times or greater than the etch rate for the material layers 304, 306, and 308. For one embodiment, the material layers include ruthenium (Ru), which has a high selectivity to typical oxide etch chemistries such as oxide plasma etch processes using carbon-fluoride based ($CF_x$-based) etch chemistries. For example, Ru has a high selectivity with respect to oxide in plasma gas etch chemistries including CF, $CF_3$, $CF_4$, and/or other carbon-fluoride based plasma etch chemistries. For example, selectivity of at least 500-to-1 and up to one thousand-to-on (1000-to-1) and higher can be achieved using Ru for the material layers 304, 306, and 308 where carbon-fluoride based etch chemistries are used for plasma oxide etch processes. Other variations can also be implemented while still taking advantage of the techniques described herein.

For additional embodiments, the material layers 304, 306, and 308 are selectively deposited and include at least one of a metal, a metal-oxide, or a metal-nitride. For one embodiment, the material for material layers 304, 306, and 308 is a metal material including at least one of Ru, Mo, W, Ti, Ta, Co, or Ni, although other metal materials or combinations of metal materials could also be used. For one further embodiment, these metals are selectively deposited to form the material layers 304, 306, and 308. For one embodiment, the material for material layers 304, 306, and 308 is a metal-oxide including at least one of AlO, TiO, or SnO, although other metal-oxide materials or combinations of materials could also be used. For one further embodiment, these metal-oxides are selectively deposited to form the material layers 304, 306, and 308. For one embodiment, the material for material layers 304, 306, and 308 is a metal-nitride including at least one of SiN, SiCN, TiN, AlN, or TaN, although other metal-nitride materials or combinations of materials could also be used. For one further embodiment, these metal-nitrides are selectively deposited to form the material layers 304, 306, and 308. For one embodiment, material layers 304, 306, and 308 are materials formed by epitaxial growth including at least one of Si, Ge, Si—Ge, an Si alloy, or a Ge alloy, although other Si and/or Ge containing materials or combinations of materials could also be used. For one further embodiment, these epitaxial layers are selectively grown to form the material layers 304, 306, and 308. Other a materials and process techniques can also be used while still taking advantage of the techniques described herein.

Figure 3B:
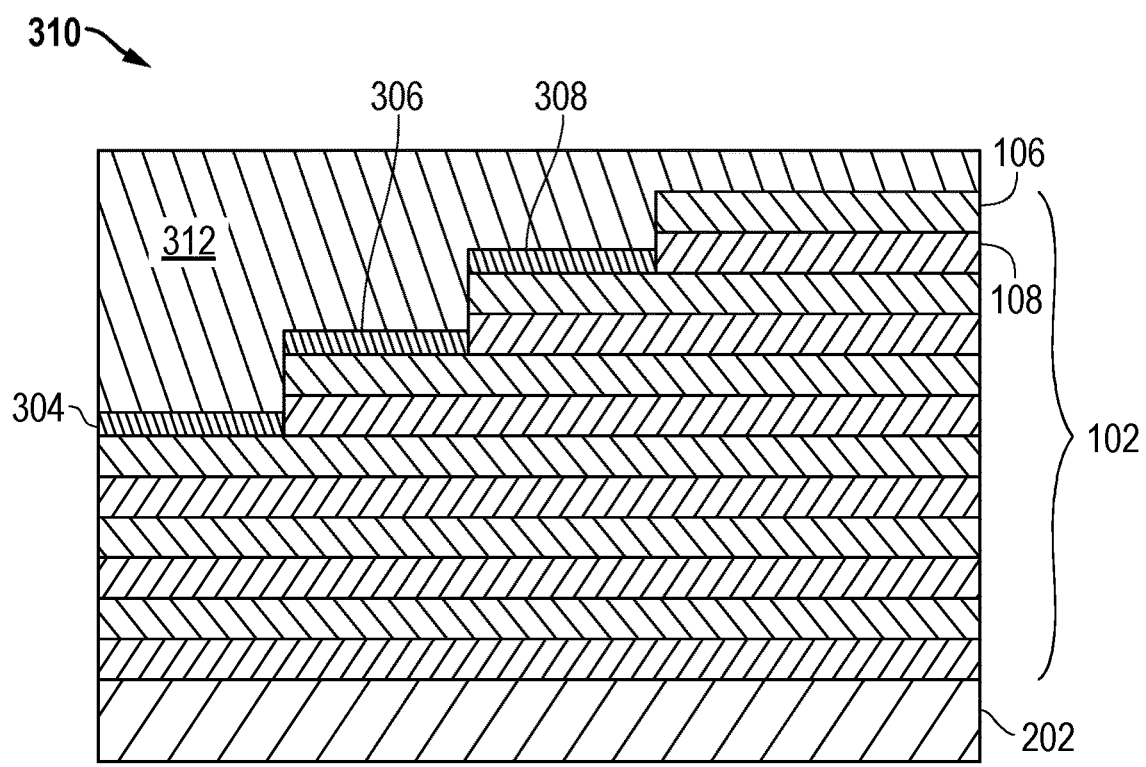

FIG. 3B is a cross-section view 310 of an example structure after one or more deposition processes have been performed to form a protective layer 312 over the OPOP stack 102 and the material layers 304, 306, and 308 as well as the steps 204/206/208 shown in FIG. 3A. The protective layer 312 is preferably an oxide layer, although other protective materials or combinations of materials can be used. It is noted that the deposition processes can include one or more atomic layer deposition (ALD) processes, chemical vapor deposition (CVD) processes, plasma deposition processes, and/or other layer deposition processes or combinations of processes.

Figure 3C:
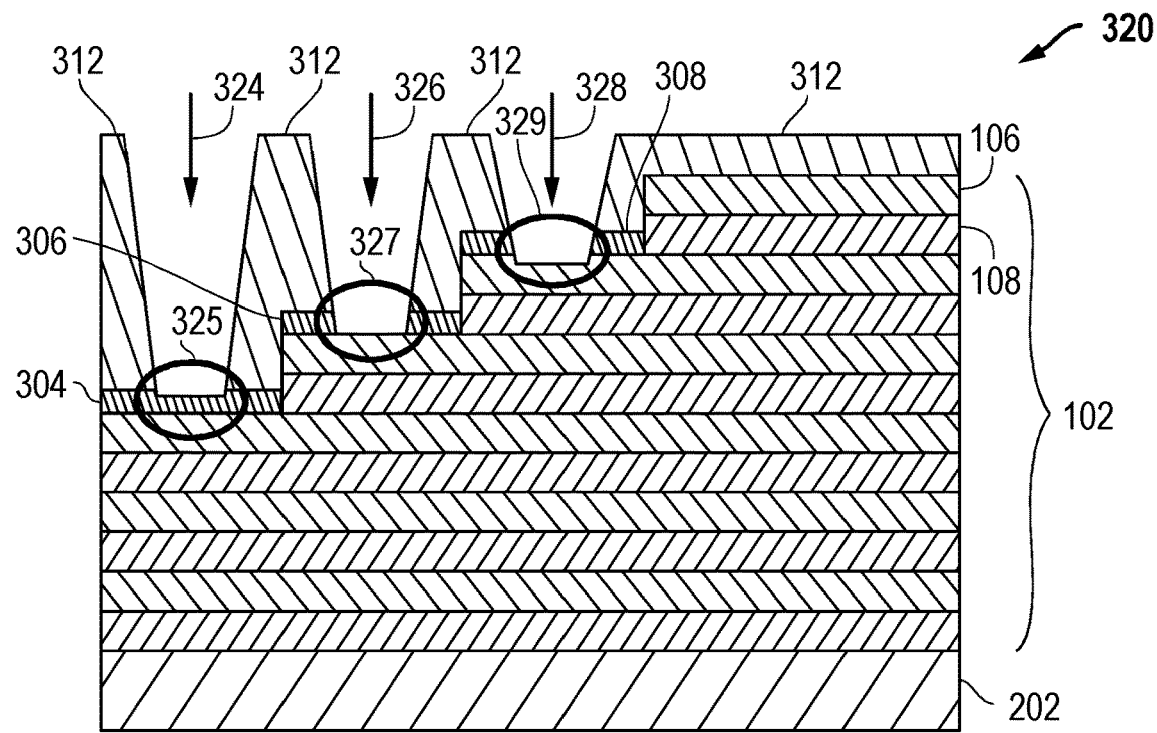

FIG. 3C is a cross-section view 320 of an example structure after one or more etch processes have been used to open contact holes 324, 326, and 328 through the protective layer 312 to the raised pad formations provided by the material layers 304, 306, and 308. It is noted that the etch processes can include one or more wet etch processes, plasma etch processes, reactive ion etch processes, and/or other etch processes or combinations of etch processes.

Figure 2C:
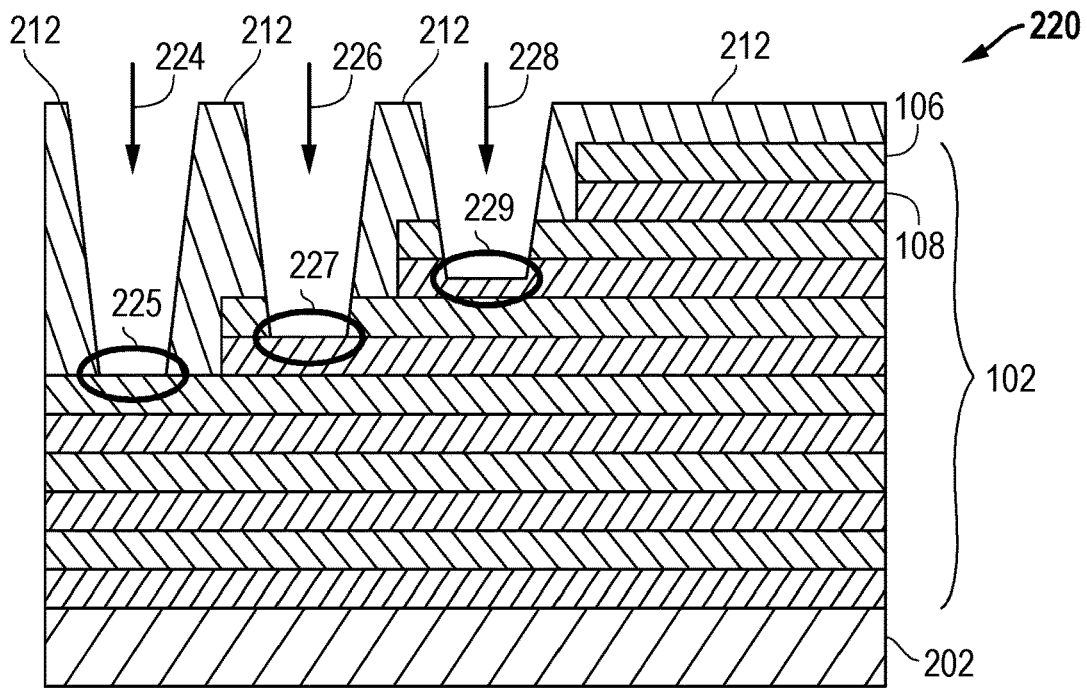

In contrast to prior solutions, the raised pad formations provided by material layers 304, 306, and 308 reduce or eliminate punch-through defects suffered by prior solution. As shown in FIG. 3C, the landing area 325 for contact hole 324 stops on the raised pad formation provided by material layer 304. Although the landing area 327 for contact hole 326 extends through the material layer 306, the contact hole 326 stops on the polysilicon layer 106 for its step. Although the landing area 329 for contact hole 328 extends through the material layer 308, it only extends a short distance into the polysilicon layer 106 for its step. Thus, punch-through defects are significantly reduced or eliminated as compared to the prior solution shown in FIG. 2C (Prior Art). For certain embodiments as described above, the material for the material layers 304, 306, and 308 is selected to have a high oxide etch selectivity to help achieve these results.

Figure 3D:
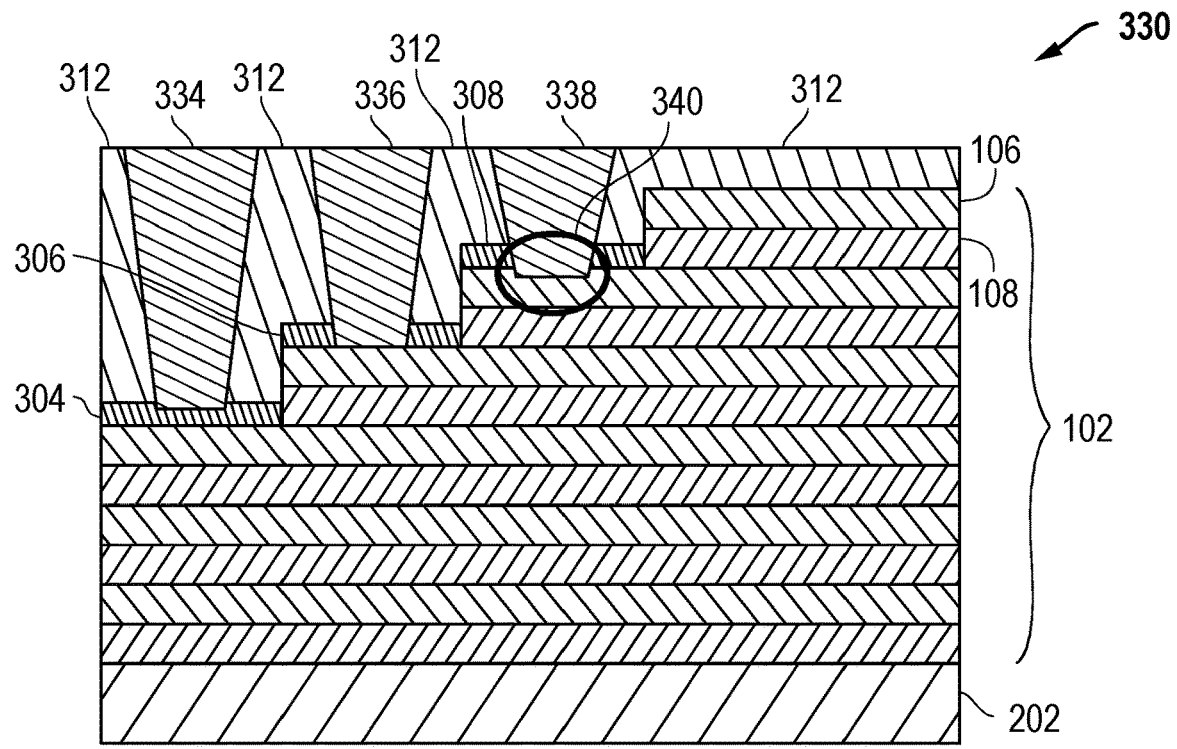

FIG. 3D is a cross-section view 330 of an example structure after one or more deposition processes have been used to form contacts 334, 336, and 338 within the contact holes 324, 326, and 328 shown in FIG. 3C. It is noted that the contacts 334, 336, and 338 can be formed using a conductive material such as titanium or a titanium-containing material, although other conductive materials or combinations of materials could also be used. It is further noted that the deposition processes can include one or more atomic layer deposition (ALD) processes, chemical vapor deposition (CVD) processes, plasma deposition processes, and/or other layer deposition processes or combinations of processes.

Figure 2D:
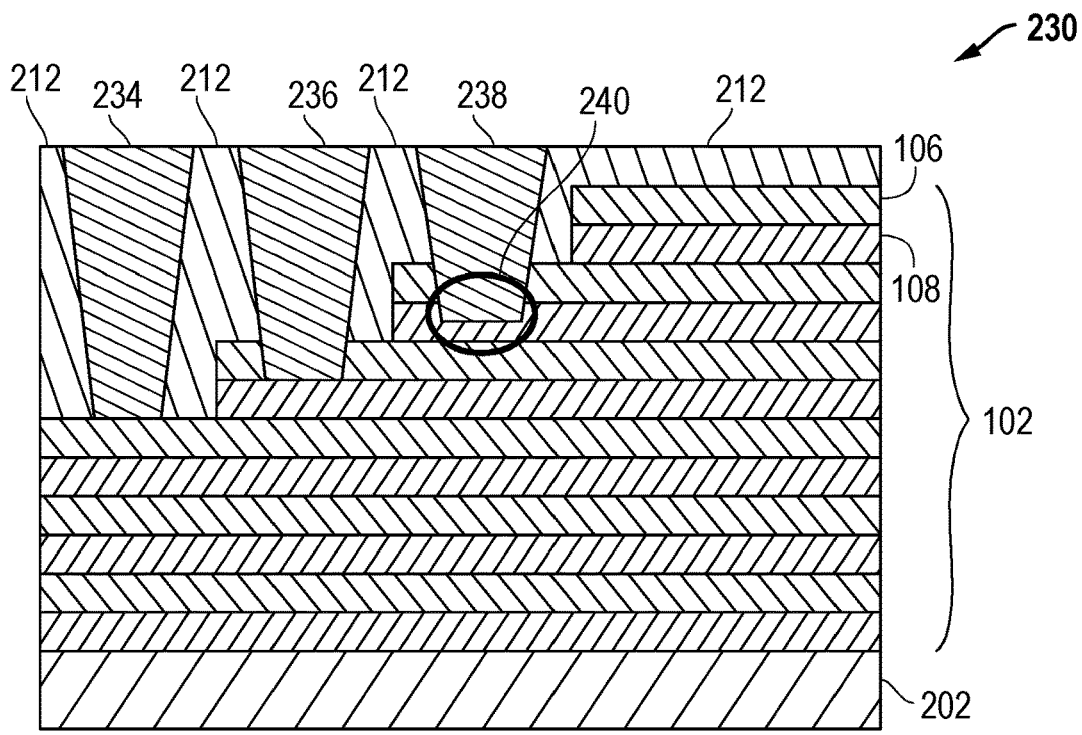

As described with respect to FIG. 3C, the raised pad formations provided by material layers 304, 306, and 308 help to reduce or eliminate punch-through defects. For example, while the contact holes 326 and 328 extend into the material layers 306 and 308, the contact hole 326 does not extend into the polysilicon layer 106 for its step, and contact hole 328 only extends slightly into the polysilicon layers 106 for its step. As such, the contacts 336 and 338 shown in FIG. 3D also stop before or only slightly into the polysilicon layers 106 for their respective steps. In particular, the contact region 340 with respect to contact 338 has not punched through into the underlying oxide layer 108, and leakage problems associated with the prior solutions shown in FIG. 2D (Prior Art) are reduced or eliminated. Device performance is thereby improved.

Figure 4:
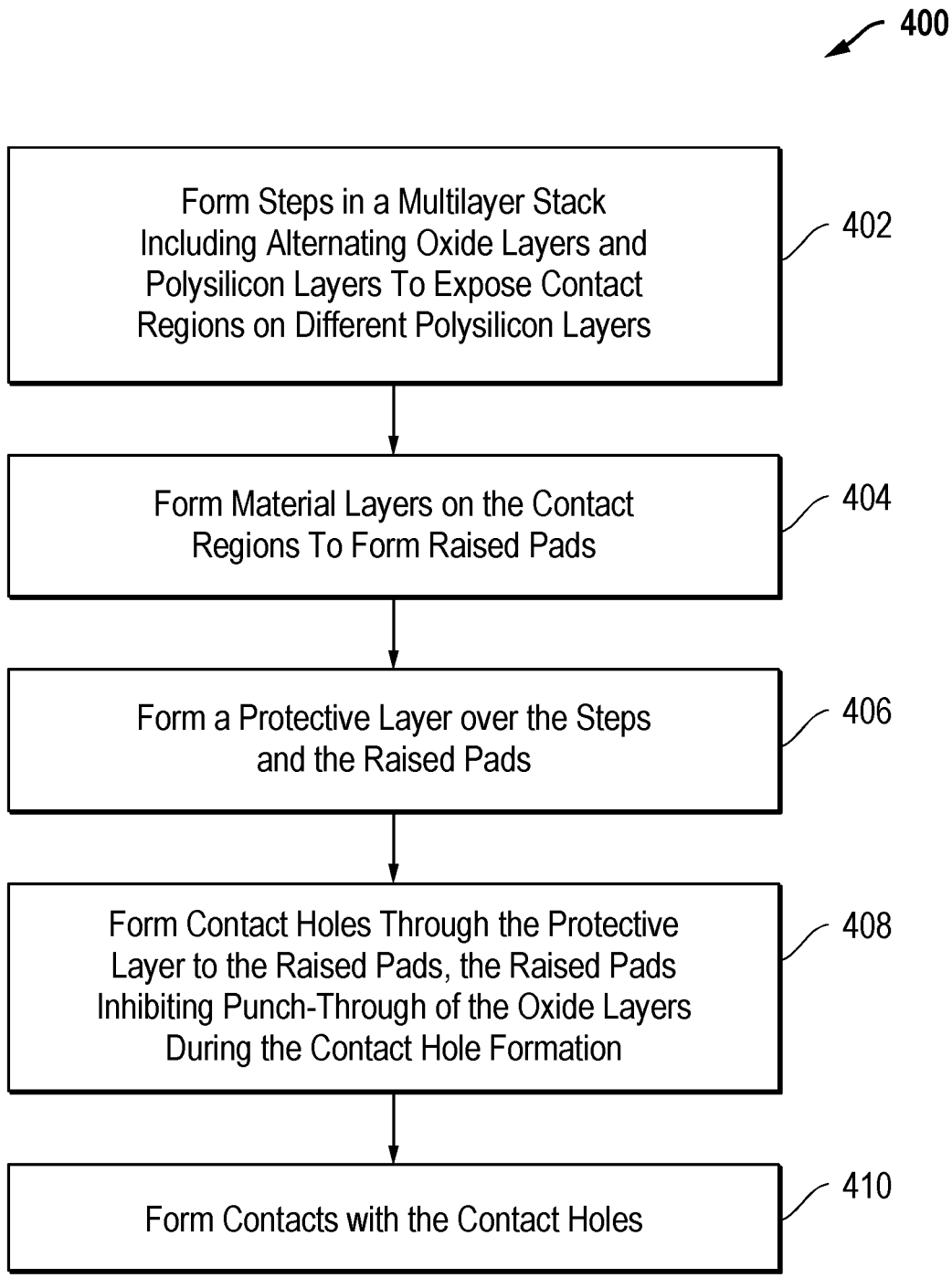
FIG. 4 is a process flow diagram of an example embodiment to form contacts for three-dimensional structures as described herein.

FIG. 4 is a process flow diagram 400 of an example embodiment where high etch selectivity materials are deposited to form raised pads in a multilayer stack to reduce or eliminate punch-through defects experienced by prior solutions. In block 402, steps are formed in a multilayer stack including alternating non-conductive layers and conductive layers to expose contact regions on different conductive layers. In block 404, material layers are formed on the contact regions to form raised pads. In block 406, a protective layer is formed over the steps and the raised pads. In block 408, contact holes are formed through the protective layer to the raised pads. As described herein, the raised pads inhibit punch-through of the non-conductive layers during the forming of the contact holes. In block 410, contacts are formed within the contact holes. Further, as described herein, the multilayer stack can be used for three-dimensional structures formed on microelectronic workpieces such as three-dimensional memory structures. It is further noted that additional and/or different process steps can also be used while still taking advantage of the techniques described herein.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that critical dimension (CD) target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any similar manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate including a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. For example, the multilayer stack may include a first and second material in addition the first material being oxide and the second material being polysilicon. Further, any benefits, advantages, or solutions to problems that are described herein with regard to specific embodiments are not intended to be construed as a critical, required, or essential feature or element of any or all the claims.

What is claimed is:

1. A method to form structures for a microelectronic workpiece, comprising:
   forming steps in a multilayer stack comprising alternating non-conductive layers and conductive layers to expose contact regions on different conductive layers;
   using an atomic layer deposition (ALD) process, selectively depositing Ruthenium (Ru) material layers on the contact regions to form raised pads;
   forming an oxide protective layer over the steps and the raised pads;
   forming contact holes through the protective layer to the raised pads using one or more plasma etch processes comprising a carbon-fluoride based chemistry having an etch rate for oxide that is at least five hundred times or greater that of the material layers; and
   forming contacts within the contact holes; wherein the raised pads inhibit punch-through of the non-conductive layers during the forming of the contact holes.

2. The method of claim 1, wherein the alternating non-conductive layers and conductive layers comprise oxide layers and polysilicon layers.

3. The method of claim 1, wherein the multilayer stack is part of a three-dimensional memory structure formed on the microelectronic workpiece.

4. The method of claim 1, wherein the non-conductive layers comprise oxide layers, wherein the protective layer comprises an oxide layer, and wherein the forming contact holes comprises one or more oxide etch processes that are selective to oxide with respect to the material layers.

5. The method of claim 1, wherein the material layers are selectively deposited and comprise at least one of a metal, a metal-oxide, or a metal-nitride.

6. The method of claim 1, wherein the material layers comprise a metal including at least one of Ru, Mo, W, Ti, Ta, Co, or Ni.

7. The method of claim 1, wherein the material layers comprise a metal-oxide including at least one of AlO, TiO, or SnO.

8. The method of claim 1, wherein the material layers comprise a metal-nitride including at least one of SiN, SiCN, TiN, AlN, or TaN.

9. A method to form structures for a microelectronic workpiece, comprising:
- forming steps in a multilayer stack comprising alternating non-conductive oxide layers and conductive layers to expose contact regions on different conductive layers;
- using an atomic layer deposition (ALD) process, selectively depositing material layers on the contact regions to form raised pads;
- forming a protective oxide layer over the steps and the raised pads;
- forming contact holes through the protective layer to the raised pads using one or more plasma etch processes comprising a carbon-fluoride based chemistry having an etch rate for oxide that is at least five hundred times or greater that of the material layers; and
- forming contacts within the contact holes; wherein the raised pads inhibit punch-through of the non-conductive oxide layers during the forming of the contact holes, wherein the material layers comprise ruthenium (Ru).

* * * * *